(12) United States Patent
Ozoe

(10) Patent No.: US 7,583,486 B2
(45) Date of Patent: Sep. 1, 2009

(54) SEMICONDUCTOR DEVICE HAVING PROTECTION DIODE

(75) Inventor: Shouji Ozoe, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 111 days.

(21) Appl. No.: 11/802,279

(22) Filed: May 22, 2007

(65) Prior Publication Data
US 2007/0285856 A1 Dec. 13, 2007

(30) Foreign Application Priority Data
Jun. 12, 2006 (JP) ............................. 2006-162769

(51) Int. Cl.
*H02H 3/22* (2006.01)
(52) U.S. Cl. ........................................ 361/56; 361/111
(58) Field of Classification Search ............. 361/56–58, 361/91.1, 111, 8, 91.7
See application file for complete search history.

(56) References Cited

U.S. PATENT DOCUMENTS

2006/0181828 A1* 8/2006 Sato et al. ................... 361/91.1
2007/0195471 A1* 8/2007 Fernandez et al. ............ 361/56

FOREIGN PATENT DOCUMENTS

| JP | A-2002-164509 | 6/2002 |
| JP | A-2002-208677 | 7/2002 |
| JP | A-2003-124324 | 4/2003 |
| JP | A-2004-281462 | 10/2004 |

\* cited by examiner

*Primary Examiner*—Danny Nguyen
(74) *Attorney, Agent, or Firm*—Posz Law Group, PLC

(57) ABSTRACT

A semiconductor device includes: a semiconductor element; a protection diode for protecting the semiconductor element from a first reverse voltage applied to the semiconductor element; and a capacitor. The protection diode is coupled in parallel to the semiconductor element. The protection diode has a forward direction, which is equal to a first applying direction of the first reverse voltage. The capacitor is coupled in parallel to the protection diode. The capacitor is capable of absorbing a second reverse voltage applied to the protection diode. The second reverse voltage is larger than a breakdown voltage of the protection diode, and has a second applying direction opposite to the first applying direction.

7 Claims, 2 Drawing Sheets

SEMICONDUCTOR DEVICE HAVING PROTECTION DIODE

CROSS REFERENCE TO RELATED APPLICATION

This application is based on Japanese Patent Application No. 2006-162769 filed on Jun. 12, 2006, the disclosure of which is incorporated herein by reference.

FIELD OF THE INVENTION

The present invention relates to a semiconductor device having a protection diode.

BACKGROUND OF THE INVENTION

A semiconductor circuit having a protection function against a reverse voltage is disclosed in JP-A-2003-124324. The semiconductor circuit includes an inner circuit and a protection circuit. The inner circuit is energized by a power source such as an exchangeable battery. The protection circuit includes a Schottky-barrier diode, which is connected in parallel to the inner circuit so that a current toward the protection circuit flows in a direction opposite to a current supplied to the inner circuit from the power source.

Accordingly, when the power source is correctly connected to the inner circuit, the current does not flow through the Schottky-barrier diode. However, when the power source is connected to the inner circuit in such a manner that the current flows reversely, the forward current flows through the Schottky-barrier diode so that the inner circuit is protected. Thus, the Schottky-barrier diode functions as a protection circuit, and electric power consumption of the protection circuit is reduced.

The Schottky-barrier diode as a protection diode is connected in parallel to a protection object circuit such as the inner circuit in such a manner that the forward direction of the protection diode is opposite to the forward direction of the protection object circuit. Thus, the protection object circuit is protected from being applied with an reverse voltage.

However, for example, when static electricity is discharged, a voltage more than a breakdown voltage of the protection diode may be instantaneously and reversely applied to the protection diode. In this case, characteristics of the protection diode may be changed, or the protection diode may malfunction. Thus, the protection diode does not function to protect the protection object circuit. Thus, it is required for the protection diode to secure the protection function.

SUMMARY OF THE INVENTION

In view of the above-described problem, it is an object of the present disclosure to provide a semiconductor device having a protection diode.

According to an aspect of the present disclosure, a semiconductor device includes: a semiconductor element; a protection diode for protecting the semiconductor element from a first reverse voltage applied to the semiconductor element; and a capacitor. The protection diode is coupled in parallel to the semiconductor element. The protection diode has a forward direction, which is equal to a first applying direction of the first reverse voltage. The capacitor is coupled in parallel to the protection diode. The capacitor is capable of absorbing a second reverse voltage applied to the protection diode. The second reverse voltage is larger than a breakdown voltage of the protection diode, and has a second applying direction opposite to the first applying direction.

In the above device, since the capacitor is capable of absorbing the second reverse voltage applied to the protection diode, the protection diode is protected from the second reverse voltage larger than the breakdown voltage of the protection diode. Thus, protection function of the protection diode is secured.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
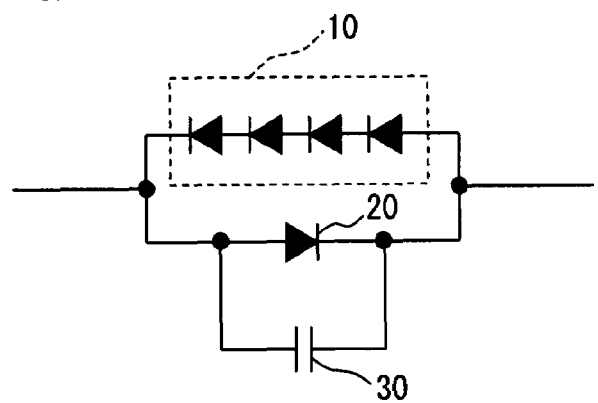
FIG. 1 is a circuit diagraph showing a semiconductor device.

FIG. 1 shows a semiconductor device according to an example embodiment of the present disclosure. The device includes a temperature sensitive diode 10 for functioning as a temperature detecting element. The diode 10 has temperature characteristic such that a relation ship between forward current and voltage is changed in accordance with temperature. The diode 10 is connected to a constant current supply (not shown) so that a forward constant current flows through the diode 10 from the constant current supply. Accordingly, when the constant current flows through the diode 10, change of voltage drop of the diode 10 is detected by a comparator or the like (not shown) so that the temperature around the diode 10 is detected.

A protection diode 20 is connected in parallel to the temperature sensitive diode 10. The forward direction of the temperature sensitive diode 10 is opposite to the forward direction of the protection diode 20. The breakdown voltage Vz of the protection diode 20 is higher than the rising voltage Vf of the temperature sensitive diode 10 in the forward direction. Thus, when the voltage is generated in the temperature sensitive diode 10 in the forward direction, the temperature sensitive diode 10 firstly turns on. Thus, the current flows only through the temperature sensitive diode 10, and no current flows through the protection diode 20.

When static electricity is discharged, a voltage more than a breakdown voltage Vz of the temperature sensitive diode 10 is reversely applied to the diode 10, the reverse voltage provides to turn on the protection diode 20 so that the forward current flows through the protection diode 20. Thus, since an excess reverse current is not applied to the temperature sensitive diode 10, the temperature sensitive diode 10 is protected from malfunctioning, and current-voltage characteristics of the temperature sensitive diode 10 are prevented from being changed.

The semiconductor device further includes a capacitor 30, which is connected in parallel to the protection diode 20.

The voltage generated by discharge of static electricity may be applied to the protection diode 20 reversely. In this case, the forward current flows through the temperature sensitive diode 10. At this time, there is a slight time delay until the temperature sensitive diode 10 turns on by the voltage. Accordingly, a voltage more than the breakdown voltage Vz may be applied to the protection diode 20.

In view of the above difficulty, the capacitor 30 is connected in parallel to the protection diode 20. Accordingly, even when the voltage more than the breakdown voltage Vz of the protection diode 20 is instantaneously and reversely applied to the protection diode 20, the voltage is absorbed by charging the capacitor 20. Accordingly, the excess reverse voltage more than the breakdown voltage Vz of the protection diode 20 is prevented from applying to the diode 20 although the excess reverse voltage may be applied to the diode 20 for a short time. Thus, the protection diode 20 is protected from malfunctioning, and current-voltage characteristics of the protection diode 20 are prevented from being changed. Protection function of the protection diode 20 is maintained.

Here, this capacitor 30 also absorbs the reverse voltage, which is applied to the temperature sensitive diode 10. Thus, the excess reverse current is prevented from applying to the diode 10.

Next, a concrete structure of the temperature sensitive diode 10, the protection diode 20 and the capacitor 30 formed in a semiconductor substrate is explained.

Figure 2A:
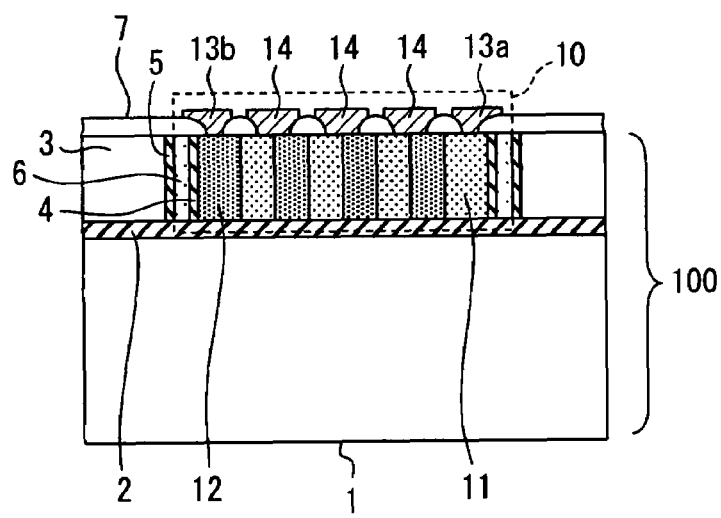
FIG. 2A is a cross sectional view showing a temperature sensitive diode.
Figure 2B:
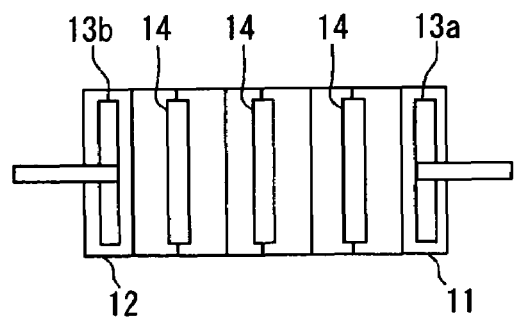
FIG. 2B is a plan view showing the temperature sensitive diode.

FIGS. 2A and 2B show the temperature sensitive diode 10. The diode 10 includes a support substrate 1, an insulation layer 2 and an active layer 3, which are stacked in this order so that a SOI substrate 100 is formed. The insulation layer 2 is made of, for example, silicon oxide, and the active layer 3 has a $P^-$ conductive type.

The diode 10 further includes a $P^+$ conductive type layer 11 and a $N^+$ conductive type layer 12, which are alternately disposed in a surface portion of the active layer 3. Each of the $P^+$ conductive type layer 11 and the $N^+$ conductive type layer 12 has a rectangular shape. A connection electrode 14 is coupled between the $P^+$ conductive type layer 11 and the $N^+$ conductive type layer 12 so that conduction of current from the $N^+$ conductive type layer 12 to the $P^+$ conductive type layer 11 is secured. A direction from the $N^+$ conductive type layer 12 to the $P^+$ conductive type layer 11 is a forward direction of the temperature sensitive diode 10.

Further, one electrode 13a is formed on the SOI substrate 100 so that the electrode 13a contacts the $P^+$ conductive type layer 11 disposed on one end. The other electrode 13b is formed on the SOI substrate 100 so that the electrode 13b contacts the $N^+$ conductive type layer 12 disposed on the other end. The electrodes 13a, 13b and the connection electrode 14 are made of, for example, aluminum. The electrodes 13a, 13b and the connection electrode 14 are electrically coupled with the $P^+$ conductive type layer 11 and the $N^+$ conductive type layer 12 through openings, respectively. The openings are formed in an insulation film 7 made of an oxide film.

The active layer 3 in the SOI substrate 100 includes a trench 4, which reaches the insulation layer 2. An insulation film 5 is formed on a sidewall of the trench 4. The insulation film 5 is made of a silicon oxide film formed by, for example, thermal oxidation method, a CVD method or a sputtering method. Alternatively, the insulation film 5 may be made of a silicon nitride film. Further, the insulation film 5 may be made of a combination film of a silicon nitride film and a silicon oxide film. After the insulation film 5 is formed on the sidewall of the trench 4, a concavity in the trench 4 is filled with a poly crystalline silicon film 6 so that a surface of the substrate 100 is flattened, i.e., flatness of the substrate 100 is improved.

Thus, a region in which the temperature sensitive diode 10 is formed is electrically separated from other regions around the region with both of the insulation layer 2 in the SOI substrate 100 and the insulation film 5 on the sidewall of the trench 4 reaching the insulation layer 2. Thus, since the temperature sensitive diode 10 is formed in the region isolated from the other regions, the temperature sensitive diode 10 is protected from being affected by electric potential of the other region. Accordingly, the temperature sensitive diode 10 can detect temperature with high accuracy.

Next, the method for manufacturing the temperature sensitive diode 100 is explained.

First, the SOI substrate 100 having the support substrate 1, the insulation layer 2 and the active layer 3 is prepared. Then, a photo resist is formed on the active layer 3, so that the photo resist is patterned in order to have an opening corresponding to the $P^+$ conductive type layer 11. By using the photo resist as a mask, a boron ion is implanted through the mask so that the $P^+$ conductive type layer 11 is selectively formed in a surface portion of the active layer 3. Similarly, another photo resist as a mask having an opening corresponding to the $N^+$ conductive type layer 12 is formed on the active layer. Then, a phosphorous ion is implanted in the active layer 3. Thus, the $N^+$ conductive type layer 12 is selectively formed in another surface portion of the active layer 3.

Next, a silicon nitride film having an opening corresponding to the trench 4 is formed on the substrate 100. By using the silicon nitride film as a mask, the active layer 3 is dry-etched so that the trench 4 reaching the insulation layer 2 is formed. Then, a silicon oxide film as the insulation film 5 is formed on the sidewall of the trench 4 by a CVD method or the like. Then, the poly crystalline silicon film 6 is deposited so that the poly crystalline silicon film 6 fills a concavity of the trench 4 by a CVD method or the like.

Then, a silicon nitride film for covering a region, on which the electrodes 13a, 13b and the connection electrode 14 are formed, is formed on the substrate 100. Then, by using the silicon nitride film as a mask, the active layer 3 is thermally oxidized. Thus, the insulation film 7 is selectively formed on the surface of the active layer 3. After the silicon nitride film is removed, the electrodes 13a, 13b and the connection electrode 14 are formed on the active layer 3.

Thus, the temperature sensitive diode 10 is formed.

Figure 3A:
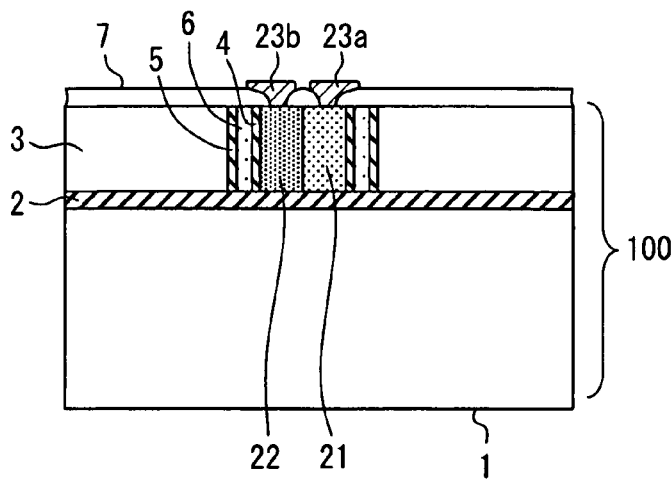
FIG. 3A is a cross sectional view showing a protection diode.
Figure 3B:
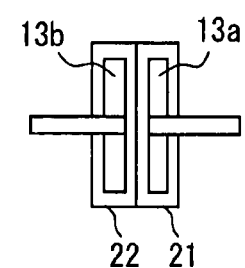
FIG. 3B is a plan view showing the protection diode.

Next, the structure of the protection diode 20 is explained with reference to FIGS. 3A and 3B.

The protection diode 20 is similar to the temperature sensitive diode 10, and difference between the protection diode 20 and the temperature sensitive diode 10 is such that the protection diode 20 only includes one $P^+$ conductive type layer 21 and one $N^+$ conductive type layer 22. Specifically, the protection diode 20 includes the $P^+$ conductive type layer 21 and the $N^+$ conductive type layer 22, which are disposed in a surface portion of the active layer 3, and a pair of electrodes 23a, 23b, which is electrically coupled with the $P^+$ conductive type layer 21 and the $N^+$ conductive type layer 22, respectively.

A region, in which the protection diode 20 is formed, is electrically separated from other regions with both of the insulation layer 2 in the SOI substrate 100 and the insulation film 5 on the sidewall of the trench 4 reaching the insulation layer 2. Thus, since the protection diode 20 is formed in the region isolated from the other regions, the protection diode 20 is protected from being affected by electric potential of the other regions. Accordingly, the protection diode 20 can protect the temperature sensitive diode 10 sufficiently.

Figure 4:
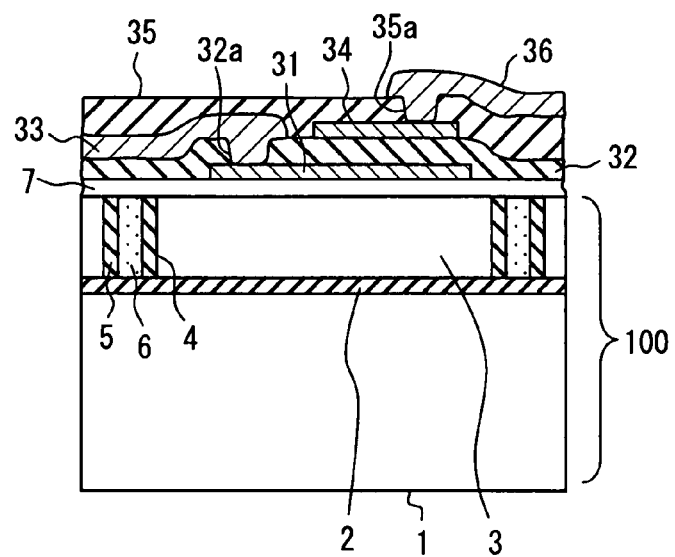
FIG. 4 is a cross sectional view showing a capacitor.

Next, the structure of the capacitor 30 is explained. As shown in FIG. 4, the capacitor 30 is formed on the insulation film 7 arranged on the active layer 3, which is isolated with the trench 4.

The capacitor 30 includes a pair of a lower electrode 31 and an upper electrode 34, which is made of conductive material such as poly crystalline silicon. Between the pair of lower electrode 31 and upper electrode 34, an interlayer insulation film 32 made of, for example, silicon oxide, is formed. The interlayer insulation film 32 functions as a dielectric film. The capacitor 30 further includes an upper insulation film 32, which covers the upper electrode 34 and the like. Furthermore, the capacitor 30 includes wiring layers 33, 36, which are electrically connected to the lower electrode 31 and the upper electrode 34 through openings 32a, 35a in the interlayer insulation film 32 and the upper insulation film 35, respectively. Thus, the capacitor 30 is formed on the SOI substrate 100.

(Modifications)

Figure 5:
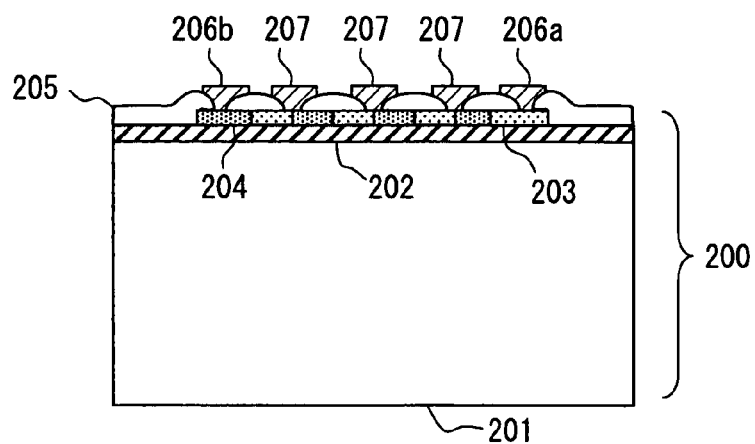
FIG. 5 is a cross sectional view showing another temperature sensitive diode.

Although the temperature sensitive diode 10 and the protection diode 20 are formed in and on the active layer 3 of the SOI substrate 100, which is made of a single crystal silicon layer, the temperature sensitive diode 10 and the protection diode 20 may be formed from poly crystalline silicon layer. FIG. 5 shows the temperature sensitive diode 10 formed from a poly crystalline silicon layer.

When the temperature sensitive diode 10 is formed from a poly crystalline silicon layer, firstly, an insulation film 202 is formed on a principal surface of a semiconductor substrate 201. A poly crystalline silicon film is formed on the insulation film 202 by a CVD method or the like. Then, the poly crystalline silicon film is etched, so that the poly crystalline silicon film has a rectangular shape.

Next, a thermal oxidation film is formed on the patterned poly crystalline silicon film. Then, a photo resist is coated on the oxidation film, an exposure step is performed, the resist is selectively removed, and an ion implantation is performed. Thus, a $P^+$ conductive type layer 203 and a $N^+$ conductive type layer 204 are formed in the poly crystalline silicon film. The $P^+$ conductive type layer 203 and the $N^+$ conductive type layer 204 are alternately formed to have a rectangular shape, respectively. Further, the $P^+$ conductive type layer 203 and the $N^+$ conductive type layer 204 are adjacent to each other.

Next, an interlayer insulation layer 205 is formed on the poly crystalline silicon film. Further, an opening is formed in the interlayer insulation layer 205, and then, a pair of electrodes 206a, 206b and a connection electrode 207 are formed.

Thus, the temperature sensitive diode 10 is formed on the semiconductor substrate 201 by using the poly crystalline silicon film. Since the temperature sensitive diode 10 is also formed on the insulation film 202, which covers principal surface of the substrate 201, the temperature sensitive diode 10 can function without affecting other regions and other elements.

In the above embodiment, the protection diode 20 protects the temperature sensitive diode 10 as a protection object. Alternatively, the protection diode 20 may protect a transistor or the like.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor element;
a protection diode for protecting the semiconductor element from a first reverse voltage applied to the semiconductor element; and
a capacitor, wherein
the protection diode is coupled in parallel to the semiconductor element,
the protection diode has a forward direction, which is equal to a first applying direction of the first reverse voltage,
the capacitor is coupled in parallel to the protection diode,
the capacitor is capable of absorbing a second reverse voltage applied to the protection diode,
the second reverse voltage is larger than a breakdown voltage of the protection diode, and has a second applying direction opposite to the first applying direction, and
the semiconductor element is a temperature sensitive diode.

2. A semiconductor device comprising:
a semiconductor element;
a protection diode for protecting the semiconductor element from a first reverse voltage applied to the semiconductor element;
a capacitor; and
a SOI substrate having an isolated region, a trench and an insulation layer, wherein
the protection diode is coupled in parallel to the semiconductor element,
the protection diode has a forward direction, which is equal to a first applying direction of the first reverse voltage,
the capacitor is coupled in parallel to the protection diode,
the capacitor is capable of absorbing a second reverse voltage applied to the protection diode,
the second reverse voltage is larger than a breakdown voltage of the protection diode, and has a second applying direction opposite to the first applying direction,
the semiconductor element, the protection diode and the capacitor are disposed in the SOI substrate,
the isolated region is electrically separated from other regions of the SOI substrate with an insulation film in the trench and the insulation layer, and
the protection diode is disposed in the isolated region.

3. A semiconductor device comprising:
a semiconductor element;
a protection diode for protecting the semiconductor element from a first reverse voltage applied to the semiconductor element;
a capacitor; and
a substrate having an insulation layer and a poly crystalline silicon layer, wherein
the protection diode is coupled in parallel to the semiconductor element,
the protection diode has a forward direction, which is equal to a first applying direction of the first reverse voltage,
the capacitor is coupled in parallel to the protection diode,
the capacitor is capable of absorbing a second reverse voltage applied to the protection diode, the second reverse voltage is larger than a breakdown voltage of the protection diode, and has a second applying direction opposite to the first applying direction, the poly crystalline silicon layer is disposed on the insulation layer, and the protection diode is formed in the poly crystalline silicon layer by a selective impurity implantation method.

4. A semiconductor device comprising:

a semiconductor element;

a protection diode for protecting the semiconductor element from a first reverse voltage applied to the semiconductor element; and a capacitor, wherein the protection diode is coupled in parallel to the semiconductor element, the protection diode has a forward direction, which is equal to a first applying direction of the first reverse voltage, the capacitor is coupled in parallel to the protection diode, the capacitor is capable of absorbing a second reverse voltage applied to the protection diode, the second reverse voltage is larger than a breakdown voltage of the protection diode, and has a second applying direction opposite to the first applying direction, the semiconductor element is a temperature sensitive diode having a predetermined relationship between a current and a voltage flowing and applying in a forward direction of the temperature sensitive diode, and the predetermined relationship is changeable based on a temperature around the temperature sensitive diode.

5. The semiconductor device according to claim 4, wherein the forward direction of the temperature sensitive diode is opposite to the forward direction of the protection diode, and is equal to the second applying direction of the second reverse voltage, and the protection diode is a Schottky-barrier diode.

6. The semiconductor device according to claim 5, further comprising:

a SOI substrate having a semiconductor layer, an insulation layer and a support layer, which are stacked in this order, wherein the SOI substrate further includes an insulation film in a trench, which is disposed on the semiconductor layer and reaches the insulation layer, the semiconductor layer includes an isolated region surrounded with the insulation film and the insulation layer so that the isolated region is electrically isolated from other regions of the semiconductor layer, and the semiconductor element, the protection diode and the capacitor are disposed in the isolated region.

7. The semiconductor device according to claim 6, wherein the breakdown voltage of the protection diode is larger than a rising voltage of the temperature sensitive diode in the forward direction, and the capacitor is capable of absorbing the first reverse voltage applied to the temperature sensitive diode.

* * * * *